United States Patent
Yoshinaga et al.

(10) Patent No.: US 11,537,769 B2
(45) Date of Patent: Dec. 27, 2022

(54) SIMULATOR AND SIMULATION METHOD

(71) Applicant: RENESAS ELECTRONICS CORPORATION, Tokyo (JP)

(72) Inventors: Megumi Yoshinaga, Tokyo (JP); Koichi Sato, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 284 days.

(21) Appl. No.: 16/872,904

(22) Filed: May 12, 2020

(65) Prior Publication Data

US 2021/0357549 A1    Nov. 18, 2021

(51) Int. Cl.
*G06F 30/20* (2020.01)
*G06F 9/46* (2006.01)

(52) U.S. Cl.
CPC .............. *G06F 30/20* (2020.01); *G06F 9/466* (2013.01)

(58) Field of Classification Search
CPC ................................ G06F 30/20; G06F 9/466
USPC ............................................................. 703/2
See application file for complete search history.

(56) References Cited

U.S. PATENT DOCUMENTS

| | | | | |
|---|---|---|---|---|
| 5,572,437 A | * | 11/1996 | Rostoker | G06F 30/33 716/108 |
| 5,634,003 A | * | 5/1997 | Saitoh | G06F 30/33 703/15 |
| 5,701,439 A | * | 12/1997 | James | G06F 30/20 703/17 |
| 5,870,308 A | * | 2/1999 | Dangelo | G06F 30/00 716/108 |
| 6,044,211 A | * | 3/2000 | Jain | G06F 8/34 716/102 |
| 6,161,211 A | * | 12/2000 | Southgate | G06F 11/2294 716/108 |

(Continued)

FOREIGN PATENT DOCUMENTS

| | | | |
|---|---|---|---|
| CN | 105751999 A | * | 7/2016 |
| CN | 110888330 A | * | 3/2020 |

(Continued)

OTHER PUBLICATIONS

Extended European Search Report issued in corresponding European Patent Application No. 21174050.1-1218, dated Sep. 13, 2021.

*Primary Examiner* — Iftekhar A Khan
(74) *Attorney, Agent, or Firm* — McDermott Will & Emery LLP

(57) ABSTRACT

Simulator includes a first core unit corresponding to the first simulation model, a second core unit corresponding to the second simulation model, a slave block unit for communicating with one of the first core unit and the second core unit, the first core unit and the second core unit and a simulation control unit for causing either to execute instructions. The first core unit includes a high-speed mode instruction execution control unit that stops executing subsequent instructions in response to a request for switching from the first simulation model to the second simulation model, and a transaction monitor unit that monitors whether or not the transaction processing between the first core unit and the slave block unit has been completed. The simulation control unit causes the second core unit to execute instructions in response to a notification of completion of the transaction processing from the transaction monitor unit.

5 Claims, 11 Drawing Sheets

(56) References Cited

U.S. PATENT DOCUMENTS

| | | | | |
|---|---|---|---|---|
| 6,272,668 B1 * | 8/2001 | Teene | G06F 30/39 | 716/113 |
| 6,463,488 B1 * | 10/2002 | San Juan | G06F 11/2242 | 714/10 |
| 6,470,482 B1 * | 10/2002 | Rostoker | G06F 30/33 | 716/108 |
| 6,523,153 B1 * | 2/2003 | Takemura | G06F 30/33 | 716/108 |
| 6,782,354 B1 * | 8/2004 | Ikegami | G06F 30/30 | 716/108 |
| 7,007,262 B2 * | 2/2006 | Kurokawa | G06F 30/30 | 716/108 |
| 7,246,333 B2 * | 7/2007 | Bingham | G06F 30/33 | 716/106 |
| 7,260,510 B2 * | 8/2007 | Sumida | G06F 30/367 | 703/2 |
| 7,296,054 B2 * | 11/2007 | Menter | G05B 19/0426 | 703/22 |
| 7,418,681 B2 * | 8/2008 | Takei | G06F 30/331 | 716/106 |
| 7,523,030 B2 * | 4/2009 | Harada | G06F 30/33 | 703/22 |
| 7,783,467 B2 * | 8/2010 | Son | G06F 30/33 | 716/108 |
| 7,996,204 B2 * | 8/2011 | Oslake | G06F 11/3447 | 703/22 |
| 8,484,389 B2 * | 7/2013 | Bhattacharya | G06F 9/4825 | 710/262 |
| 8,543,367 B1 * | 9/2013 | Van Rompaey | G06F 30/3312 | 703/14 |
| 8,639,487 B1 * | 1/2014 | Ezer | G06F 30/327 | 716/102 |
| 2002/0032559 A1 * | 3/2002 | Hellestrand | G06F 30/33 | 703/22 |
| 2003/0225565 A1 * | 12/2003 | Garcia | G06F 30/33 | 703/23 |
| 2008/0313587 A1 * | 12/2008 | Nightingale | G06F 30/33 | 714/E11.16 |
| 2009/0055155 A1 * | 2/2009 | Klein | G06F 9/455 | 703/22 |
| 2010/0070748 A1 * | 3/2010 | Duan | H04L 12/40006 | 703/2 |
| 2010/0100365 A1 * | 4/2010 | Moriyama | G05B 17/02 | 703/8 |
| 2017/0024500 A1 * | 1/2017 | Sebastian | G06F 30/20 | |
| 2021/0255242 A1 * | 8/2021 | Funatsu | G01R 31/31707 | |
| 2021/0325198 A1 * | 10/2021 | Chen | H04W 4/029 | |

FOREIGN PATENT DOCUMENTS

| | | | | |
|---|---|---|---|---|
| EP | 2851815 A1 * | 3/2015 | | G05B 17/02 |
| EP | 3910521 A1 * | 11/2021 | | G06F 30/20 |
| EP | 3594759 B1 * | 4/2022 | | G05B 13/04 |
| GB | 2508769 A * | 6/2014 | | G06F 11/261 |
| JP | 2010174253 A * | 8/2010 | | G06F 17/10 |
| JP | 2013-196245 A | 9/2013 | | |
| WO | WO-2013179076 A1 * | 12/2013 | | G06F 11/261 |

* cited by examiner

SIMULATOR AND SIMULATION METHOD

BACKGROUND

The present invention relates to a simulator and a simulation method, and relates to a simulator and a simulation method with arts for switching simulation models.

[Patent Document 1] Japanese Unexamined Patent Application Publication No. 2013-196245

Simulator is used, for example, to develop electronic control systems for automobile applications. In such electronic control system development, software is becoming larger in scale. There is also an increasing number of electronic control components, such as semiconductor device installed in automobiles. In order to improve the quality of electronic control systems, the use of simulator is increasing in the early stages of designs and in the validation of the implementation of electronic control systems and components.

In order to ensure the safety and reliability of future automatic driving technology, enormous running tests are required. Therefore, verification with high-speed and high-precision is required by using the simulator in addition to the actual driving data obtained by actual driving. In recent years, simulator covers the entire system, and the scope of simulator covers a wide range.

As simulator, there are various simulators that differ in the granularity of the simulation (communication data granularity, timing precision). Here, the communication data granularity indicates the data unit handled in one cycle. Reducing the data units handled in one cycle or/and increasing the timing precision increases the precision of the simulation. However, simulator that prioritizes the precision of the simulation results in longer simulation times. On the other hand, there is a problem that high precision cannot be obtained with the simulator that prioritizes the speed of the simulation.

Patent Document 1 discloses switching simulation models from high-precision simulations to high-speed simulations. In other words, Patent Document 1 describes techniques for ensuring the orderliness of bus transaction when switching simulation models. In Patent Document 1, it is described that the order of bus transaction is ensured by adding modifications to buses, peripheral blocks, and memory blocks classified as slave blocks that operate passively with inputs from a master block or the like. This allows the simulation to be switched when the simulation model is switched without any malfunction occurring.

SUMMARY

In the technique disclosed in Patent Document 1, when the number of slave blocks increases, there is a problem that the man-hours to be remodeled becomes enormous.

Other objects and novel features will become apparent from the description of this specification and the accompanying drawings.

Semiconductor device according to an embodiment is as follows.

Simulator includes a first core unit corresponding to the first simulation model, a second core unit corresponding to the second simulation model different from the first simulation model, a slave block unit for communicating with either the first core unit and the second core unit, and a simulation control unit for causing either the first core unit and the second core unit to execute instructions. Here, the first core unit includes a first core mode instruction execution control unit that stops the execution of subsequent instructions in response to a request for switching from the first simulation model to the second simulation model, and a transaction monitor unit that monitors whether or not the transaction processing between the first core unit and the slave block has been completed. In addition, the simulation control unit causes the second core unit to execute instructions in response to a notification of completion of the transaction processing from the transaction monitor unit.

DETAILED DESCRIPTION

Figure 1:
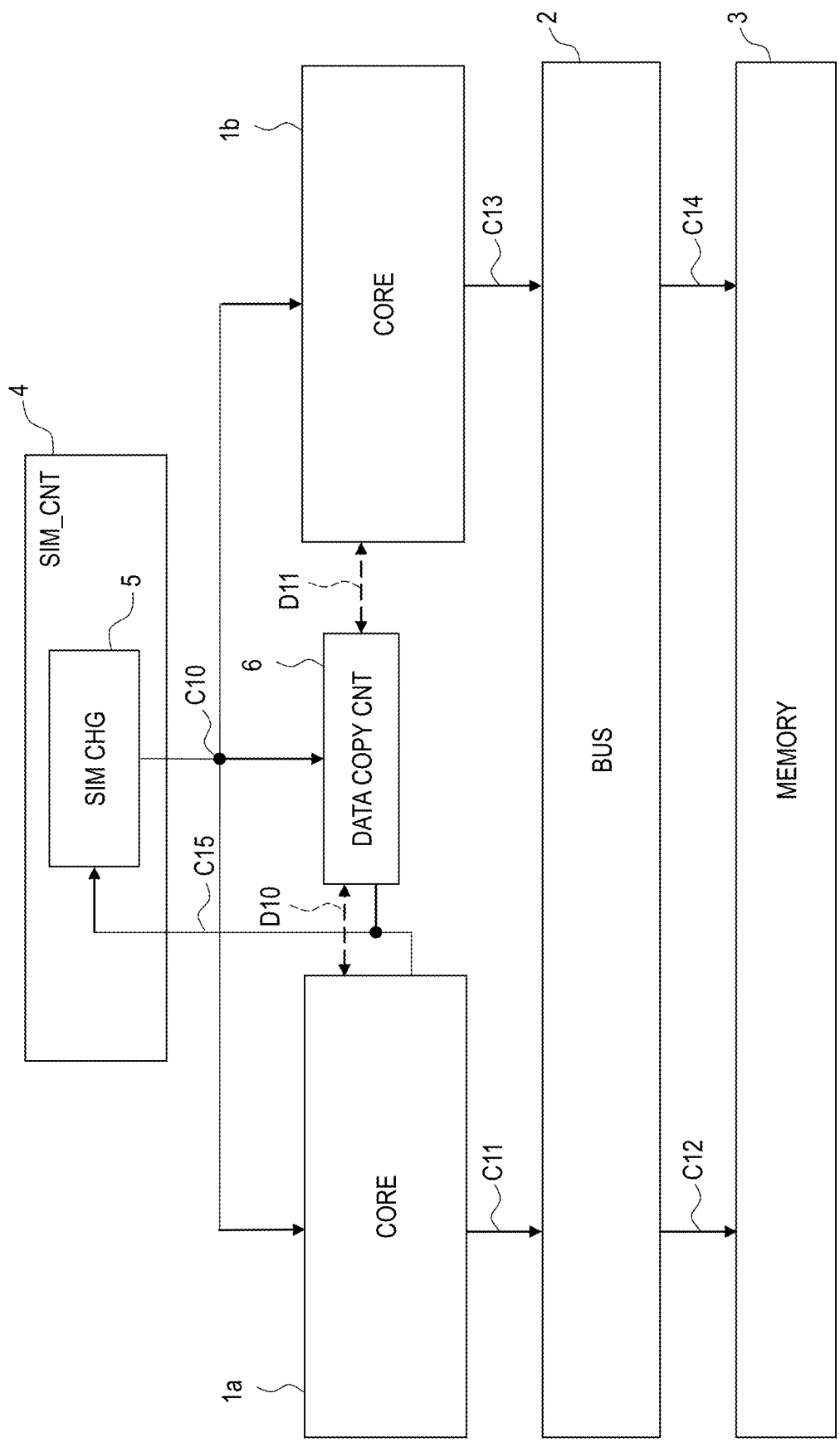
FIG. 1 is a block diagram showing the configuration of a simulator according to first embodiment.

Hereinafter, embodiments of the present invention will be described with reference to the accompanying drawings. Incidentally, the disclosure is merely an example, those skilled in the art can be easily conceived about appropriate changes to keep the essence of the invention, naturally contained in the scope of the present invention.

Further, in the present specification and the drawings, the same elements as those described above with respect to the previous figures, with the same reference numerals, may be omitted detailed description as appropriate.

First Embodiment (Hardware Configuration of the Simulator)

Hereinafter, a simulator will be described with reference to a plurality of embodiments, the simulator according to the embodiment is realized by the computer executes a program for simulation. Similarly, a simulation method has also been realized by a computer executing a program for simulation.

Figure 11:
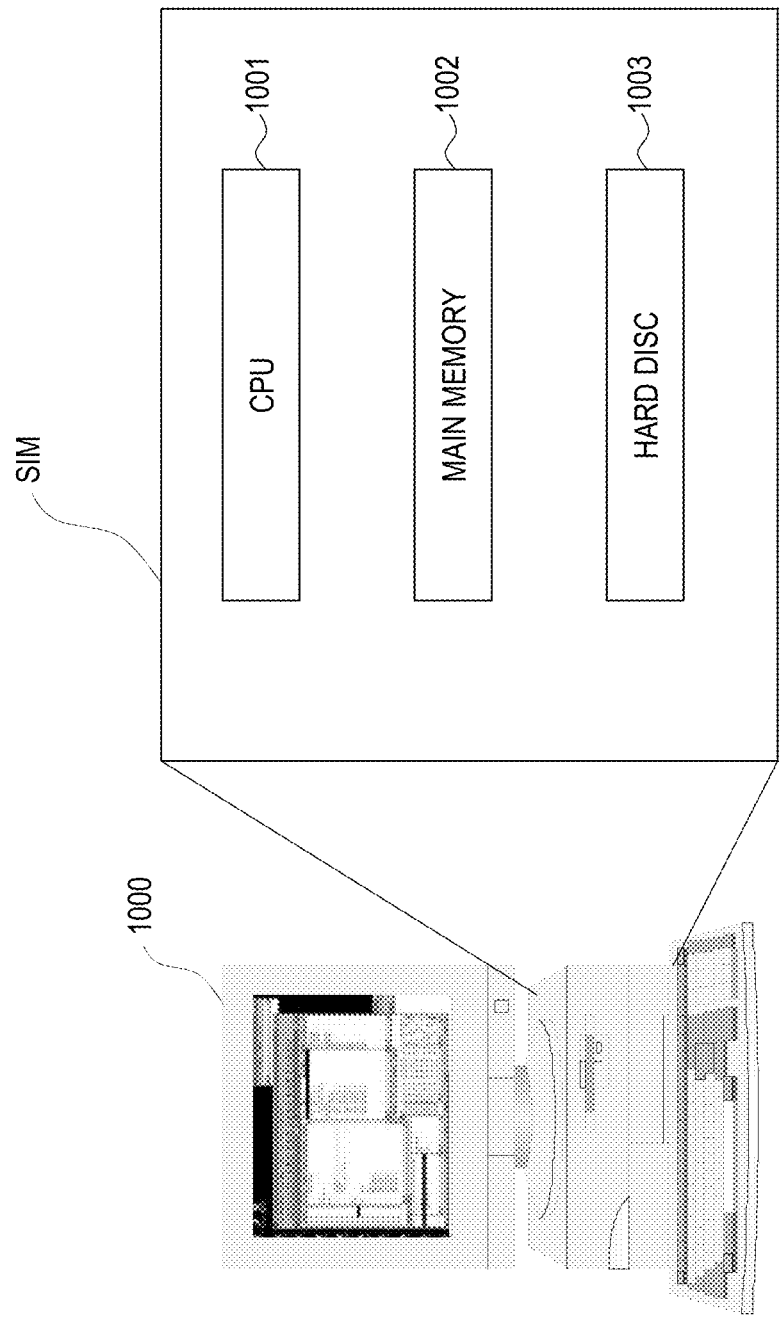
FIG. 11 is a diagram showing a configuration of a simulator according to first to fourth embodiments.

The drawing is used to illustrate how to use a computer to realize a simulator. FIG. 11 is a diagram showing a configuration of a simulator according to first to fourth embodiments below. In FIG. 11, SIM shows a simulator. simulator SIM includes a computer 1000. The computer 1000 includes a processor (CPU) 1001, a main memory 1002, a hard disk 1003, and the like. Without particular limitation, a simulation program is stored in the hard disk 1003. The simulation program is read into main memory 1002 and executed by processor 1001. This provides simulator and simulation methods.

In the following explanation, the simulator is used to simulate a single semiconductor device. In this instance, semiconductor device is integrated with a processor, peripheral blocks, memories and buses, etc. Peripheral blocks, memories and buses are slave blocks, and processors are master blocks. That is, peripheral blocks and memories, etc. are connected to the processor via buses and passively accessed from the processor. Of course, the simulator according to first embodiment may be an electronic control component composed of a plurality of semiconductor device as an object of the simulation.

The processor 1001 shown in FIG. 11 differs from the processor provided by the semiconductor device as simulation target. In the following explanation, processor 1001 is also referred to as a host processor, and the processor provided by semiconductor device is also referred to as a target processor.

(Simulator)

FIG. 1 is a block diagram showing the configuration of a simulator according to first embodiment. In FIGS. 1, 1a and 1b shows a core unit. In the following explanation, 1a is also referred to as a first core unit, 1b may also be referred to as a second core unit. Further, in FIG. 1, 2 is a bus unit, 3 is a memory unit, 4 is a simulation control unit (hereinafter, SIM_CNT), and 6 is a data copy control unit (Data Copy CNT).

In first embodiment, a processor (target processor) included in semiconductor device to be simulated is simulated by the core unit 1a, 1b and the data copy control unit 6, the bus is simulated by the bus unit 2, and the memory is simulated by the memory unit 3.

The core unit 1a and the core unit 1b correspond to different simulation models. In first embodiment, the core unit 1a corresponds to a high-precision simulation model (hereinafter also referred to as the first simulation model or the high-precision model). In contrast, the core unit 1b is less accurate than the core unit 1a, but corresponds to a simulation model (hereinafter also referred to as a second simulation model or a high-speed model) that is faster than the core unit 1a.

The simulation control unit 4 controls the entire simulator SIM. For example, it executes time-management of the simulation, executing instructions to the core unit 1a and the core unit 1b or the like. In FIG. 1, code 5 in the simulation control unit 4 shows a simulation model switch unit (SIM CHG). The simulation model switch unit 5 notices the generation of mode switching requests to the core units 1a and the core unit 1b by the notification control signals C10. Either of the cores 1a and 1b operates according to the notification control signals C10. That is, the simulation of the target processor will be performed in either the high-precision model and the high-speed model.

By executing the program by the target processor, access such as communication is performed to the slave block such as the memory. This is realized from the core unit 1a or the core unit 1b when the simulation of the target processor is being executed in the core unit 1a or the core unit 1b, as accesses to the slave block unit (target unit) 2, 3 to simulate the slave block. In FIG. 1, as the target unit, the bus unit 2 and the memory unit 3 is shown, but is not limited thereto, it may be a peripheral block unit that simulates a peripheral block.

When switching between the core unit 1a and the core unit 1b, it is required to pass the data or the like generated in the core unit which has been operated prior to switching to the core unit of the switching destination. The data copy control unit 6 operates to pass data between the core unit 1a and the core unit 1b. For example, when the mode is switched from a high-precision mode in which simulation is performed in a high-precision model to a high-speed mode in which simulation is performed in a high-speed model, the data copy control unit 6 copies the data generated by the core unit 1a to the core unit 1b. In first embodiment, the core unit 1a and the core unit 1b have the same abstract-level to be simulated. Therefore, the data copy control unit 6 copies the data generated by the core unit 1a to the core unit 1b without converting. Thus, even after the mode switching, it is possible to simulate the target processor in the high-speed mode continuously from the high-precision mode. The same applies to the case where the mode is switched from the high-speed mode to the high-precision mode.

In FIG. 1, solid lines C11 to C15 indicate control signals, and broken lines D10 and D11 indicate data between the core units. To avoid the drawings becoming complicated, solid lines C10-C15 and broken lines D10 to D11 are shown by one each. However, each of the control signals C10 to C15 and the data D10 to D11 represents a plurality of control signals and data. The same applies to drawings other than FIG. 1.

Figure 2:
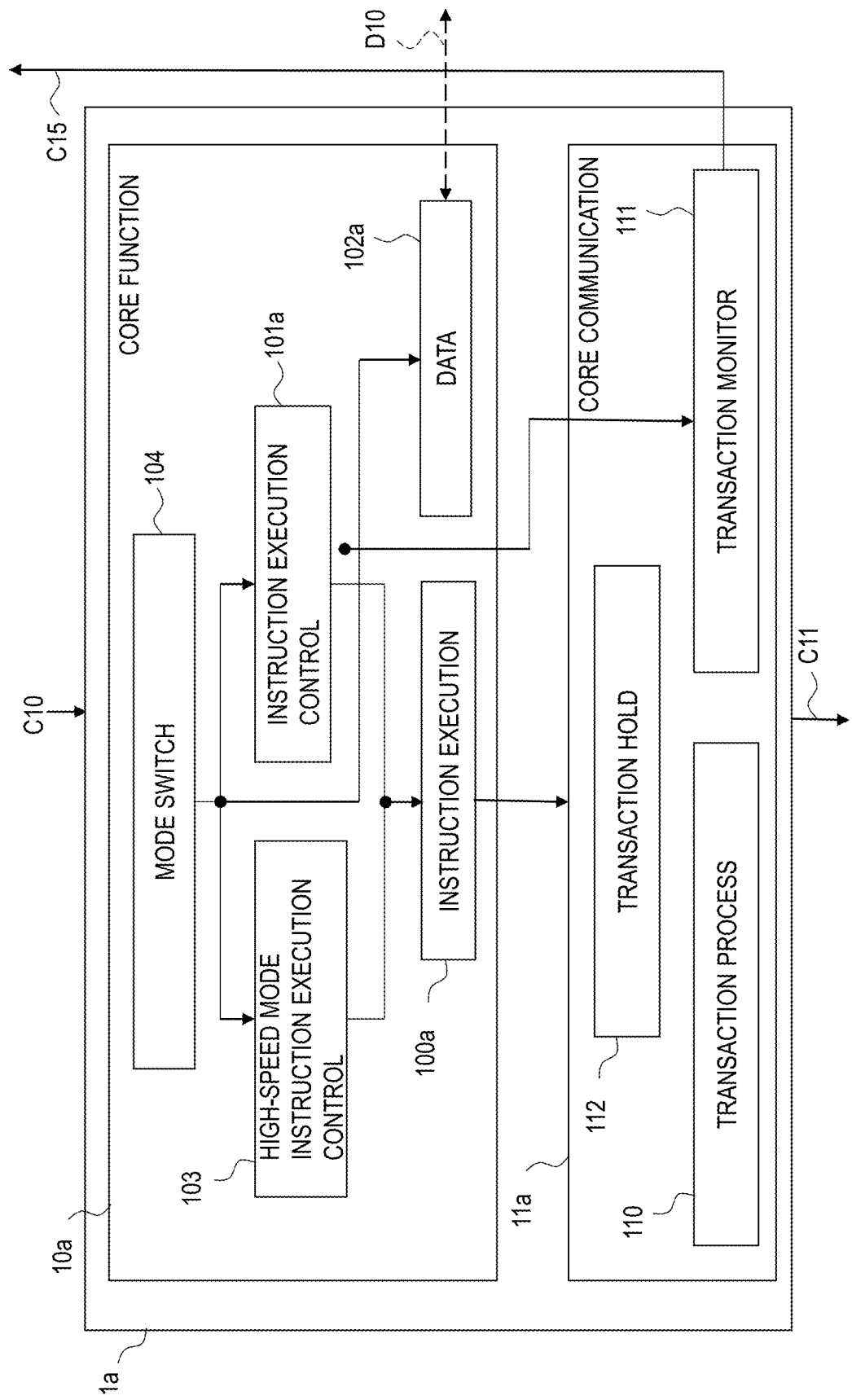
FIG. 2 is a diagram showing a configuration of a core unit according to first embodiment.
Figure 3:
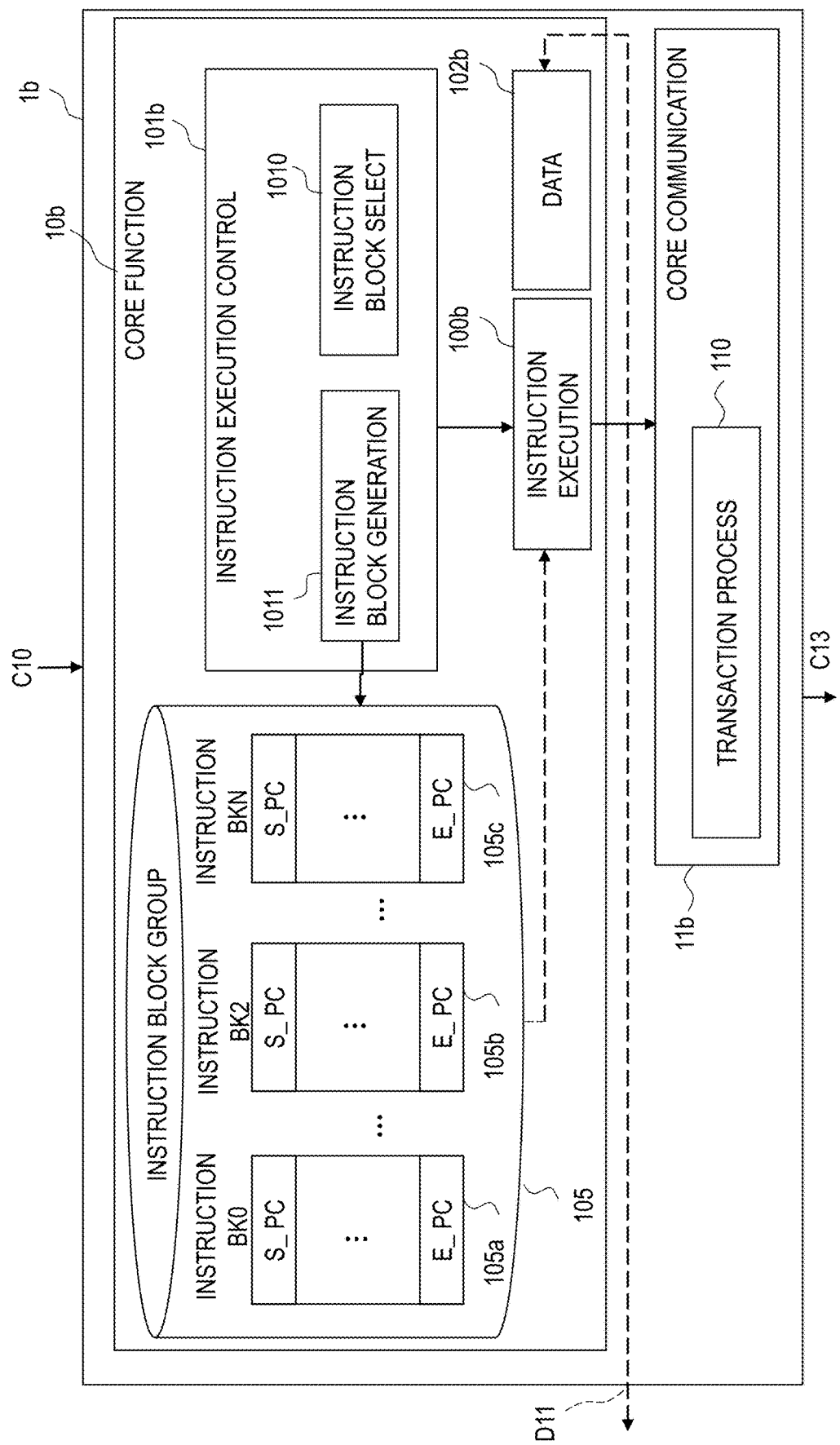
FIG. 3 is a diagram showing a configuration of a core unit according to first embodiment.
Figure 4:
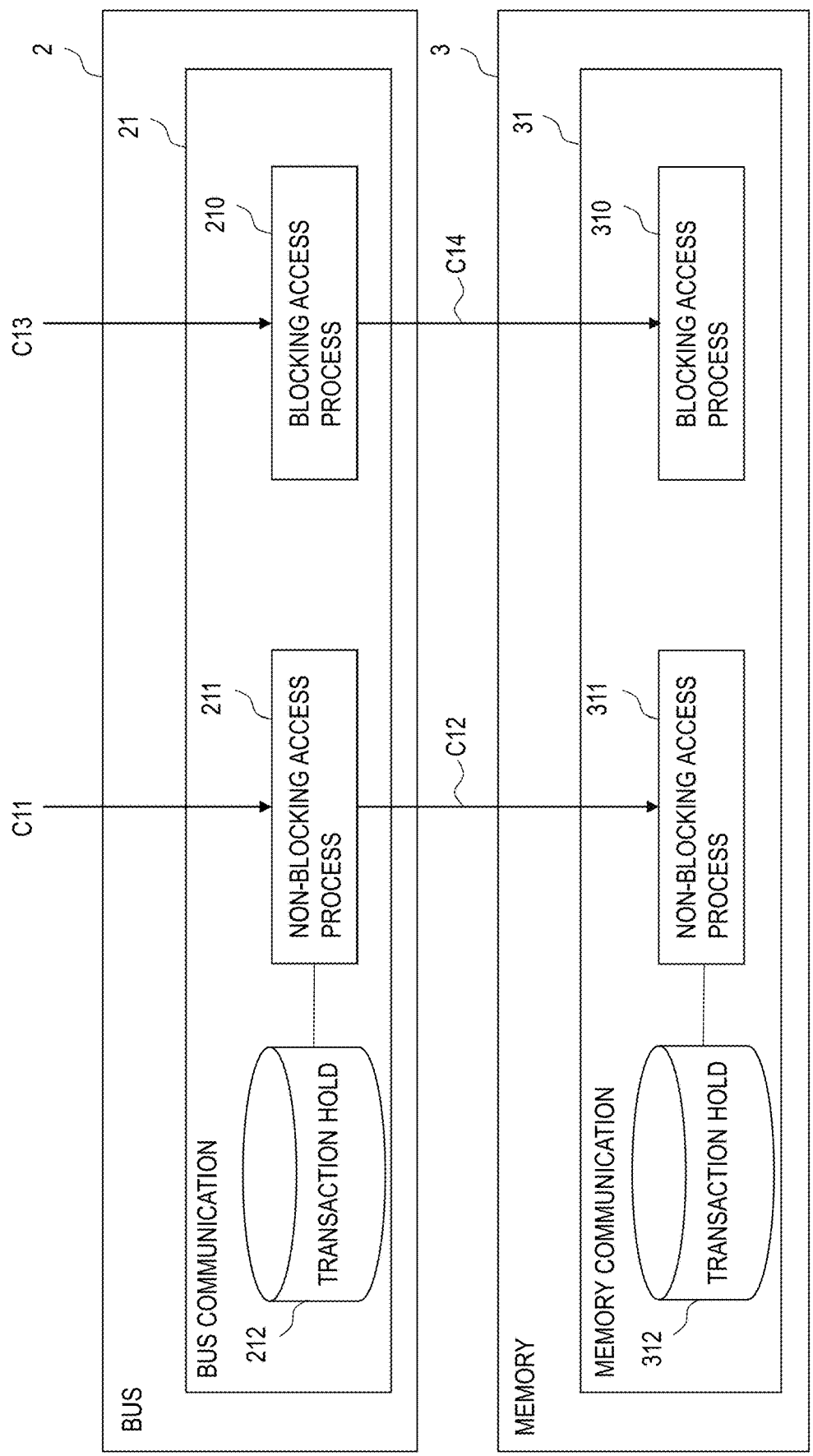
FIG. 4 is a diagram showing a configuration of a bus unit and a memory unit according to first embodiment.

Next, the core units 1a, 1b, the bus unit 2, and the memory unit 3 shown in FIG. 1 will be described in detail with reference to the drawings. FIG. 2 is a diagram showing a configuration of a core unit 1a according to first embodiment. FIG. 3 is a diagram showing a configuration of a core unit 1b according to first embodiment. Further, FIG. 4 is a diagram showing a configuration of a bus unit 2 and a memory unit 3 according to first embodiment.

(Configuration of the Core Unit 1a)

As shown in FIG. 2, the core unit 1a includes a core functional unit 10a and a core communication unit 11a.

The core function unit 10a includes an instruction execution unit 100a, an instruction execution control unit 101a, a data unit 102a, a mode switch unit 104, and a high-speed (first core) mode instruction execution control unit 103.

The core communication unit 11a includes a transaction process unit 110, a transaction monitor unit 111, and a transaction hold unit 112.

The mode switch unit 104 controls the instruction execution control unit 101a and the high-speed mode instruction execution control unit 103 in accordance with the notification control signal C10. The instruction execution unit 100a is controlled by the instruction execution control unit 101a and the instruction execution control unit 103 in the high-speed mode.

The instruction execution control unit 101a and the high-speed mode instruction execution control unit 103 control, for example, updating (advancing) of the program counter in accordance with an instruction from the mode switch unit 104. The instruction execution unit 100a executes a program for a high-precision model by updating the program counter. By the program for the high-precision model is executed, for example, the data is generated. The generated data is provided to the data unit 102a and the core communication unit 11a. The instruction execution unit 100a controls the core communication unit 11a. The data provided to the data unit 102a is provided to the data copy control unit 6 as data D10 at the time of switching from the high-precision mode to the high-speed mode. On the contrary, when switching from the high-speed mode to the high-precision mode is performed, the data D10 from the data copy control unit 6 is provided to the data unit 102a and used in the program for the high-precision model.

The core communication unit 11a performs communication of data between the core function unit 10a and the bus unit 2. In first embodiment, the core unit 1a and the core communication unit 11a perform a transaction process with non-blocking access. Although not specifically limited, the transaction hold unit 112 holds the transaction whenever a transaction involving the communication of data generates. Each time the generated transaction is processed by the transaction process unit 110, the transaction held in the transaction hold unit 112 is erased. The transaction monitor unit 111 monitors whether or not the generated transaction is completed by checking whether or not there is a transaction held in the transaction hold unit 112.

We now discuss transaction, blocking and non-blocking. A transaction represents a sequential process that cannot be divided. Non-blocking represents that it is possible to process multiple processes in parallel, blocking represents not parallel, sequential processing of multiple processes.

In first embodiment, in the core unit 1a, processing is performed in non-blocking, and in the core unit 1b, processing is performed in blocking. Since non-blocking processing is performed, in the core unit 1a, a plurality of processes can be executed in parallel in the same way as the target processor composed of hardware, thereby improving the precision. However, in order to perform processing in parallel, since the task switch is generated, the processing of the core unit 1a is relatively slow. In contrast, in the core unit 1b, although parallel processing similar to the target processor is difficult, it is possible to reduce the generation of task switches and improve the speed of processing.
(Configuration of the Core Unit 1b)

As shown in FIG. 3, the core unit 1b, similarly to the core unit 1a, includes a core function unit 10b and a core communication unit 11b.

The core function unit 10b includes an instruction execution unit 100b, an instruction execution control unit 101b, a data unit 102b, and an instruction block group 105. The instruction execution control unit 101b controls the instruction execution unit 100b, the instruction execution unit 100b executes instructions stored in the instruction block group 105. By executing the instructions, the program for the high-speed model is executed. By executing the program for this high-speed model, for example, data is generated. The generated data is provided to the data unit 102b and the core communication unit 11b. Further, the instruction execution unit 100b controls the core communication unit 11b. The data provided to the data unit 102b is provided to the data copy control unit 6 as the data D11 at the time of switching from the high-speed mode to the high-precision mode. Conversely, when the switching is performed from the high-precision mode to the high-speed mode, the data D11 from the data copy control unit 6 is provided to the data unit 102b and is used in a program for a high-speed model.

The instruction execution control unit 101b includes an instruction block generation unit 1011 and an execution instruction block selection unit 1010.

The instruction block group 105 stores a plurality of instruction blocks 105a to 105c (instruction BK0 to instruction BKN) generated by the instruction block generation unit 1011. In the target program to be executed in the target processor, the instruction block generation unit 1011 generates a chunk of instruction sequences without branches depending on the execution result of the instruction as one instruction block and stores the chunk in the instruction block group 105. That is, in the target program executed in the target processor, the instruction sequence from the branch destination of the branch instruction to the next branch instruction is extracted, and the instruction sequence of the host processor corresponding to the instruction sequence is stored in the instruction block group 105 as a single instruction block.

In other words, the program executed by the target processor is divided into a plurality of instruction sequences, and the plurality of instruction sequences for the host processor corresponding to the plurality of instruction sequences becomes a plurality of instruction blocks 105a to 105c. In FIG. 3, S_PC indicates the value of the program counter at the start in the instruction block, and E_PC indicates the value of the program counter at the end in the instruction block.

The execution instruction block selection unit 1010 selects an instruction block to be executed from the instruction block group 105 and notifies the start program counter S_PC of the selected instruction block to the instruction execution unit 100b. By executing the instruction of the notified start program counter S_PC, the instruction execution unit 100b executes the selected instruction block. Thus, in the core unit 1b, processing is performed by blocking access.

Further, the core communication unit 11b, unlike the core communication unit 11a, and includes only the transaction process unit 110. The transaction process unit 11 executes the transaction processing related to the data communication between the core function unit 10b and the bus unit 2.
(Configuration of the Bus Unit and the Memory Unit)

With reference to FIG. 4, the configuration of the bus unit 2 and the memory unit 3 will be described.

Bus unit 2 includes a bus communication unit 21. The bus communication unit 21 includes a non-blocking access process unit 211 to which a control signal C11 from the core unit 1a is provided, a blocking access process unit 210 to which a control signal C13 from the core unit 1b is provided, and a transaction hold unit 212 coupled to the non-blocking access process unit 211.

The memory unit 3 includes a memory communication unit 31. The memory communication unit 31 includes a blocking access process unit 310, a non-blocking access process unit 311, and a transaction hold unit 312 coupled to the non-blocking access process unit 311. The control signal C14 from the blocking access process unit 210 is provided to the blocking access process unit 310, and the control signal C12 from the non-blocking access process unit 211 is provided to the non-blocking access process unit 311.

Thus, for the output from the core unit 1b, the process of blocking access is performed, and for the output from the core unit 1a, the process of non-blocking access is performed. In the transaction hold units 212 and 312, the non-blocking access processing is performed by the non-blocking access process units 211 and 311 until the transaction in which the transaction is held and held is completed.
(Operation)

Figure 5:
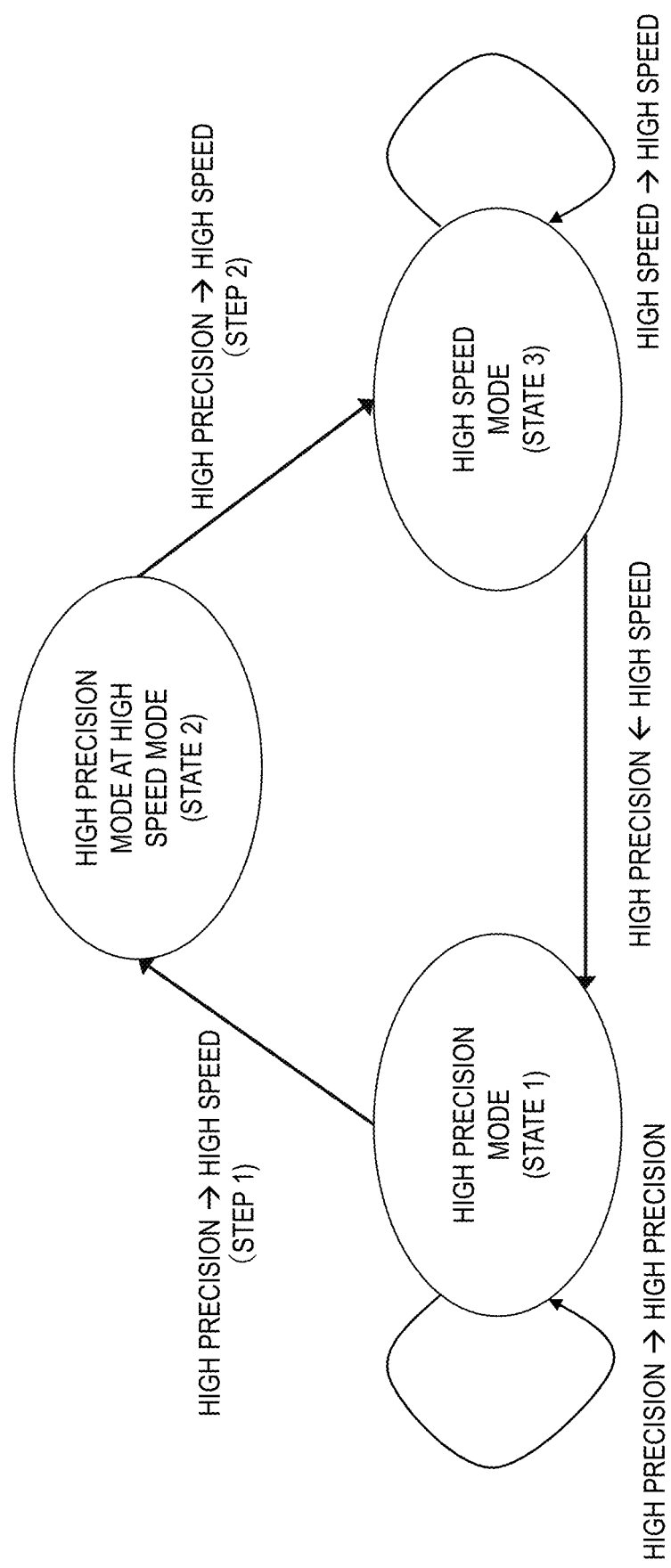
FIG. 5 is a diagram for explaining the transitions of the simulator according to first embodiment.

Next, the operation of mode switching will be described. FIG. 5 is a diagram for explaining the transitions of the simulator according to first embodiment.

Simulator SIM has three states from state 1 to state 3 (hereinafter also referred to as the first mode to the third mode). In the core unit 1a, state 1 is a state in which the simulation is performed in high-precision mode. In the core unit 1b, state 3 is a state in which the simulation is performed in high-speed mode. As shown in FIG. 5, when transitioning from the high-precision mode to the high-precision mode, the state 1 will be repeated. Similarly, when the transitioning from the high-speed mode to the high-speed mode, the state 3 will be repeated.

When a request for switching from high-precision mode to high-speed mode occurs, it transitions from state 1 to state 3 via state 2 and two steps (step1 and step2). State 2 is a state of high-precision mode at high-speed mode. This state 2 will be described in the following operation description.

When a request for switching from a high-speed mode to a high-precision mode occurs, the state directly transitions from state 3 to state 1.

(Switching from High-Precision Mode to High-Speed Mode)

Next, in case that a request for switching from the high-precision mode to the high-speed mode occurs in a state 1 in which the high-precision mode is being executed will be described with reference to FIGS. 1 to 5.

When a request for switching from the high-precision mode to the high-speed mode occurs, the simulation model switch unit 5 notifies the mode switch unit 104 of the core unit 1a of the occurrence of the mode switching request by the notification control signal C10. In this notification, the step (step 1) shown in FIG. 5 occurs and the state transits from state 1 to state 2.

By the notification control signal C10, when mode switch unit 104 determines that the high-precision mode is notified, it instructs to continue the execution of the instruction in the high-precision mode to the instruction execution control unit 101a. Thus, in FIG. 5, the transition from the high-precision mode to the high-precision mode is realized. That is, state 1 repeats.

On the other hand, when the notification control signal C10 notifies that the switching from the high-precision mode to the high-speed mode is requested, the mode switch unit 104 determines that the mode is the high-precision mode after the switching to the high-speed mode, and shifts to the state 2. In the state 2, the instruction execution unit 100a is controlled by the instruction execution control unit 103 in the high-speed mode instead of the instruction execution control unit 101a. Further, the mode switch unit 104 instructs the high-speed mode time instruction execution control unit 103 not to update (progress) the program counter, until there is no uncompleted non-blocking access, instructs to advance only the simulation time.

In the state 2, it is notified from the mode switch unit 104 to the transaction monitor unit 111 that there is a request for mode switching. In response to this notification, the transaction monitor unit 111 monitors whether or not all non-blocking transaction processing has been completed. That is, although the transaction process unit 110 performs the non-blocking transaction processing that is transmitted to the bus unit 2, the transaction monitor unit 111 monitors whether or not this transaction has been completed using the transaction hold unit 112. When confirming the completion of all non-blocking transaction processing (non-blocking access), the transaction monitor unit 111 notifies the simulation model switch unit 5 of the absence of incomplete non-blocking access by the notification control signal C15.

After receiving the notification from the transaction monitor unit 111, the simulation model switch unit 5 instructs the data copy control unit 6 to copy the data by the notification control signal C10. The data copy control unit 6 acquires data from the data unit 102a of the core unit 1a, and copies the data to the data unit 102b of the core unit 1b.

When the data copy is completed, the data copy control unit 6 notifies the simulation model switch unit 5 of the completion of the data copy by the notification control signal C15.

Simulation model switch unit 5, after receiving a notification from the data copy control unit 6, switches the core unit to be executed from the core unit 1a to the core unit 1b (step 2). That is, the core unit 1b is caused to execute an instruction so that the high-speed mode program is executed. This state is a state 3 shown in FIG. 5.

(Switching from High-Speed Mode to High-Precision Mode)

Switching from the high speed mode to the high precision mode is performed after the instruction execution control unit 101b in the core unit 1b executes any of the instruction blocks (e.g., the instruction block 105c) in response to the notification control signal C10 and stops execution of the instruction block of. Thereafter, the simulation model switch unit 5 stops executing the instruction on the core unit 1b and executes the instruction on the core unit 1a. At the time of this switching, the data copy control unit 6 copies the data of the data unit 102b to the data unit 102a.

In the simulator SIM according to first embodiment, the core function unit 10a includes a high-speed mode instruction execution control unit 103, and a mode switch unit 104. Thus, in the core unit 1a of the high-precision mode, it is possible to advance only the simulation time without updating the program counter until the uncompleted non-blocking access is eliminated, thereby completing all the processing of the non-blocking access. Thus, in first embodiment, when a request for switching from the high-precision mode to the high-speed mode occurs, it is confirmed that the processing of all the non-blocking access transaction related to the instruction executed in the high-precision mode has been completed, and then the core unit for executing the instruction is switched from the core unit of the high-precision mode to the core unit of the high-speed mode.

In other words, in first embodiment, when a request for switching a simulation model occurs, the execution of an instruction is stopped at the core unit side, and the completion of an incomplete bus transaction can be waited for. Therefore, as described in Patent Document 1, there is no need to implement a mechanism for switching simulation models on the slave block side. Therefore, even if the slave block is increased, it is possible to prevent the man-hours from increasing.

Second Embodiment

Figure 6:
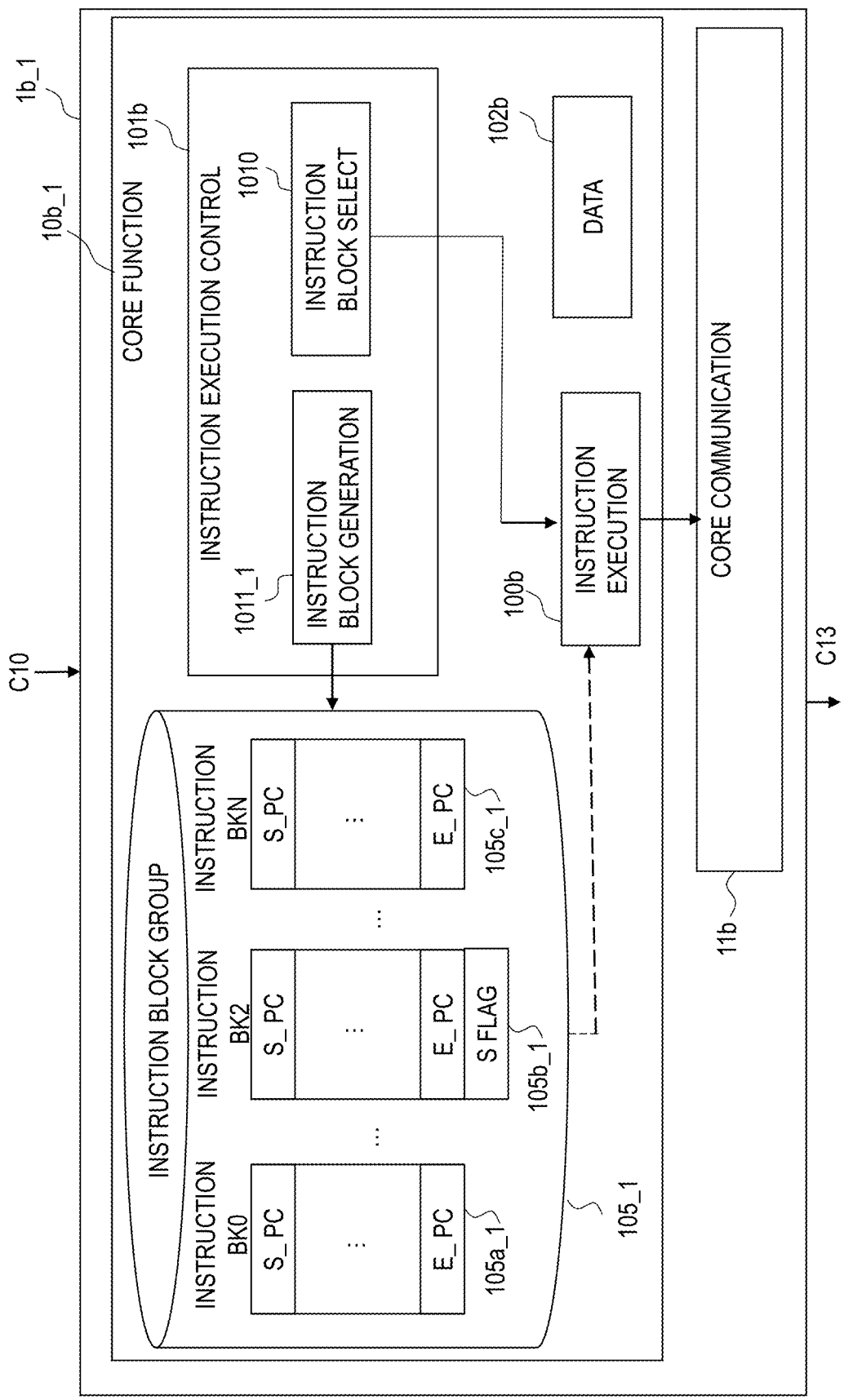
FIG. 6 is a diagram showing a configuration of a core unit according to second embodiment.

Simulator relating to second embodiment is similar to the simulator described in FIGS. 1 to 5, and thus the differences are mainly explained. The difference is that the configuration of the core unit 1b has been changed. Therefore, the following mainly describes the core unit 1b according to second embodiment. FIG. 6 is a diagram showing a configuration of a core unit according to second embodiment.

In FIG. 6, 101b_1 indicates an instruction execution control unit, and 105_1 indicates an instruction block group. Since the instruction execution control unit 101b_1 is similar to the instruction execution control unit 101b shown in FIG. 3, and the instruction block group 105_1 is similar to the instruction block group 105, differences will be described.

The instruction execution control unit 101b_1 includes an execution instruction block selection unit 1010 described in FIG. 3 and a modified instruction block generation unit 1011_1. Similar to the instruction block generation unit 1011 described in FIG. 3, the instruction block generation unit 1011_1 generates an instruction block and stores the generated instruction block in the instruction block group 105_1. The difference is that the instruction block generation unit 1011_1 generates the time synchronization data (time synchronization code) S_flag, adds it to a predetermined instruction block, and ends the generation of the instruction block. The instruction execution unit 100b, by executing the time synchronization data S_flag, to synchronize the simulation time. That is, the time between the core unit 1a and the core unit 1b is synchronized. Here, the predetermined instruction block, when the mode switching from the high-speed mode to the high-precision mode, an instruction block including a program counter to be mode switched, is an instruction block to be executed next.

For example, it is assumed that instruction block 105b_1 (instruction BK2) is executed followed by instruction block 105c_1 (instruction BKN). It is also assumed that the mode is switched from the high-speed mode to the high-precision mode by a desired program counter in the instruction block 105c_1. In this case, when the instruction block generation unit 1011_1 generates the time synchronization data S_flag and adds it after the end program counter E_PC when the instruction block 105b_1 is generated.

In the high-speed mode, when the execution instruction block selection unit 1010 selects the instruction block 105b_1 and the instruction execution unit 100b executes the instruction block 105b_1, the time synchronization data is executed after the instruction block 105b_1 (instruction sequence between S_PC and E_PC) is executed. Control shifts to the simulation control unit 4 by execution of the time synchronization data, synchronization of the simulation time is performed. As a result, the simulation time is synchronized before the mode switching, and the control shifts to the simulation control unit 4, so that the simulation model switch unit 5 can output the notification control signal C10 for notifying the mode switching request and switch the mode to be executed to the high-precision mode.

According to the simulator related to second embodiment, the program counter value can be used as an event for mode switching. The time synchronization code is added to the instruction block just before the instruction identified by the value of the program counter which is this event (embedded). Thus, while suppressing a decrease in the processing speed of the simulation of the high-speed mode to be executed in the core unit 1b, at the value of the desired program counter, it is possible to execute the mode switching.

Third Embodiment

In second embodiment, time synchronization data was embedded in the instruction block when the instruction block 105b_1 was generated. That is, the time synchronization data was embedded in the instruction block 105b_1 so that the synchronization of the simulation time can be taken immediately before the program counter as an event of the mode switching. The time synchronization data is also composed of instructions of the host processor in the same way as the instructions configuring the instruction block 105b_1. Thus, for embedding the time synchronization data in a specific instruction block, it is difficult to set the timing of the mode switching dynamically. Specifically, there is a problem that it is not possible to set the program counter value that is the event of the mode switching dynamically.

To solve this problem, it is conceivable to write a program so as to check whether the value of the program counter is a value of the program counter for time synchronization and determine whether or not the time is synchronized each time the instruction is executed. However, when such a process is performed, the processing speed is reduced by about 30%, so that the merit of the high-speed mode is reduced.

In third embodiment, in the high-speed mode, while suppressing a decrease in processing speed, a core unit capable of dynamically changing the timing of the mode switching is provided.

Figure 7:
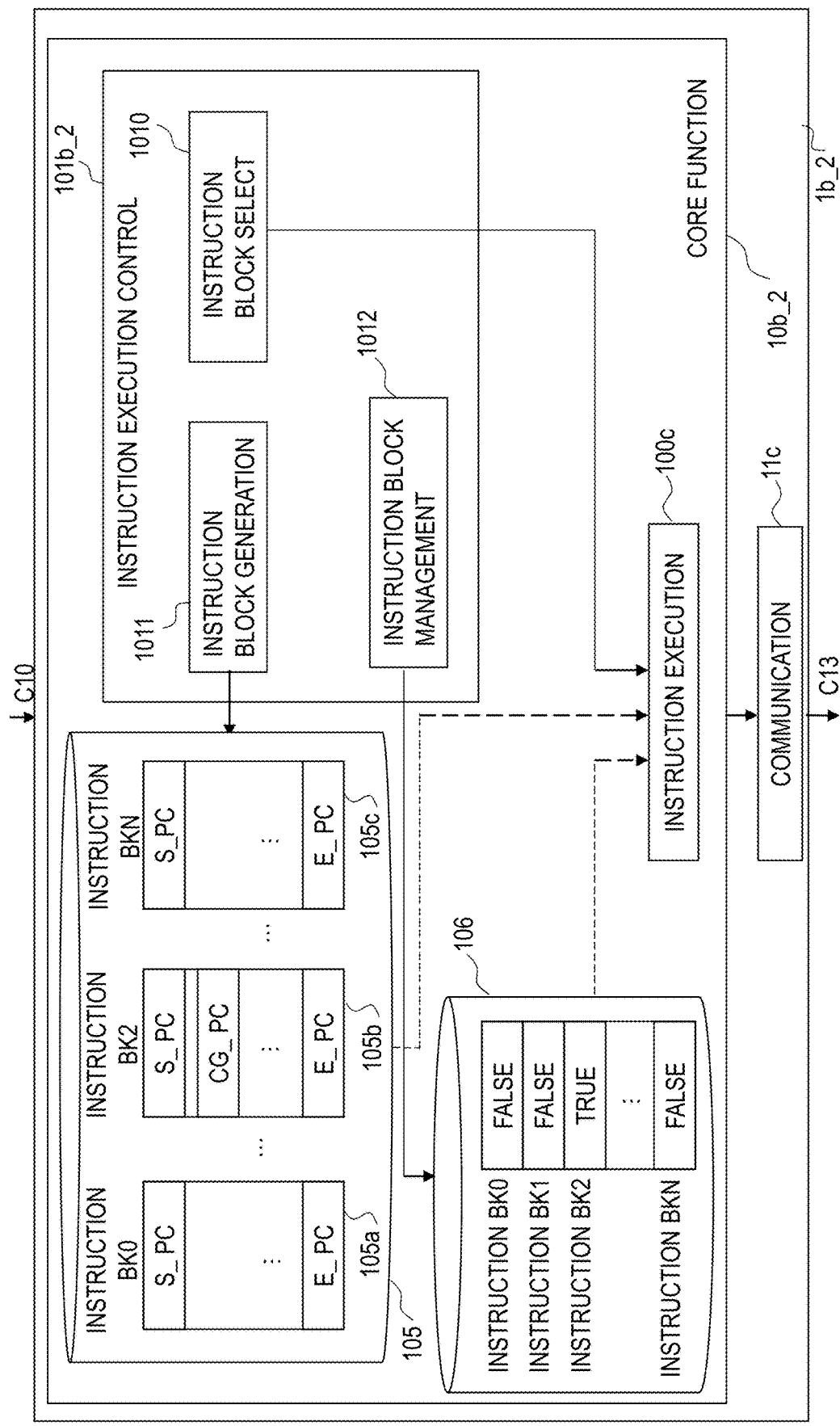
FIG. 7 is a diagram showing a configuration of a core unit according to third embodiment.

In third embodiment, the core unit 1b described in second embodiment is further changed. FIG. 7 is a diagram showing a configuration of a core unit according to third embodiment. FIG. 7 is similar to FIGS. 3 and 6, mainly the differences will be described.

The main difference is that, in FIG. 7, the instruction block management table 106 and the instruction block management unit 1012 are added. With this addition, the code of the core function unit has been changed to 10b_2, and the code of the instruction execution control unit to which the instruction block management unit 1012 has been added has been changed to 101b_2.

As described with reference to FIG. 3, the instruction block generation unit 1011 generates instruction blocks 105a to 105c (instructions BK0 to BKN) and stores them in the instruction block group 105. In FIG. 7, CG_PC shows the value of the program counter as an event of the mode switch. FIG. 7 shows an example in which the instruction sequence of the host processor comprising instruction block 105b (instruction BK2) includes an instruction identified by the value CG_PC of the program counter. However, it is not limited thereto, the value CG_PC of the program counter to be an event may be a value (desired value) in any instruction block.

When the value of the program counter serving as an event of mode switching is updated, the instruction block management unit 1012 confirms a plurality of instructions BK0 to BKN included in the instruction block group 105. That is, the instruction block management unit 1012 checks whether or not an instruction BK including the value CG_PC of the program counter exists in the instruction block group 105.

The instruction block management table 106 is paired with the instruction BK and information (false/true) indicating whether or not the corresponding instruction BK includes the value CG_PC of the program counter. When it is determined that the instruction BK includes the value CG_PC of the program counter, the instruction block management unit 1012 sets true as the information corresponding to the instruction BK. When it is determined that the instruction BK does not include the value CG_PC of the program counter, the instruction block management unit 1012 sets false as the information corresponding to the instruction BK.

The execution instruction block selection unit 1010 selects an instruction block having the value of the program counter of the instruction to be executed as the value S_PC of the program counter of the start and notifies the instruction execution unit 100c of the selected instruction block. The instruction execution unit 100c acquires the notified instruction block from the instruction block group 105 and acquires information corresponding to the notified instruction block from the instruction block management table 106.

When the acquired information is false, the instruction execution unit 100c executes the instruction without checking the value of the program counter of the instruction in the acquired instruction block. When the acquired information is true, the instruction execution unit 100c checks whether or not the value of the program counter of the instruction in the acquired instruction block matches the value of the program counter for the event, CG_PC. In the case of a mismatch in this check, the instruction execution unit 100c executes the instruction. On the other hand, when it is determined in the check that there is a match, the instruction execution unit 100c forcibly terminates the execution of the acquired instruction block at that point in time, and performs synchronization of the simulation time.

Referring to FIG. 7, in the instruction block management table 106, the information corresponding to the instruction block 105b (instruction BK2) is a true. Therefore, the instruction execution unit 100c executes the instruction blocks 105a (instruction BK0) and 105c (instruction BKN) without checking. On the other hand, the instruction block 105b (instruction BK2) is checked for a match or mismatch between the value of the program counter of each instruction and the value of the program counter for events, CG_PC. If they match in the check, at the value of the matched program counter, the instruction execution unit 100c stops the execution of the subsequent instruction, and transfers the control to the simulation control unit 4. Simulation control unit 4 performs synchronization of the simulation time. As a result, the simulation control unit 4 can output the mode switching notification control signal C10 to switch the mode.

According to third embodiment, the core unit 1b has an instruction block management table that enables distinction of an instruction block including the value of a program counter that is an event of mode switching. Thus, it is possible to set the value of the program counter to be an event of the mode switching dynamically, while suppressing the influence on the processing speed only to the execution of the corresponding instruction block, it is possible to perform the mode switching with the value of the target program counter.

Each of instruction blocks 105a to 105c is an instruction sequence from the branch destination to the next branch instruction. Thus, each of the instruction blocks 105a-105c is a chunk of instructions without branches. As described above, the instruction block management unit 1012 checks whether or not the value CG_PC of the program counter which is an event is included in the instruction block, but does not need to check all instructions in the instruction block. That is, the instruction block management unit 1012 can confirm whether or not "the value of the program counter S_PC≤the value of the program counter at the start of the instruction block=the value of the program counter CG_PC≤the value of the program counter at the end of the instruction block E_PC" holds true. In this case, if the relationship is established, the instruction block control unit 1012 sets true as the information corresponding to the instruction block, and sets false as the information if the relationship is not established.

Similarly, when a new instruction block is stored in the instruction block group, the instruction block management unit 1012 may determine whether or not the new instruction block includes the value CG_PC of the program counter that is an event, and set the determination result as information in the instruction block management table 106.

Fourth Embodiment

From first to third embodiments describe example of switching simulation models at the same abstract level. That is, the example of switching the mode between core units with different timing precision at the same abstract level is explained. Fourth embodiment illustrates switching between simulated models with varying levels of abstraction.

Because of the switch between simulation models with differing abstract levels, problems that cannot be solved occur in the examples described in the first to third embodiments For example, if the abstraction levels are the same, the data stored in the data units 102a and 102b in the core units 1a and 1b are of the same type. Therefore, at the time of switching, it is possible to continue the simulation by copying the data. On the other hand, if the abstract level is different, a new problem arises that the type of data stored in the core unit 1a differs from the type of data stored in the core unit 1b, and a device is required for copying the data at the time of switching.

Figure 8:
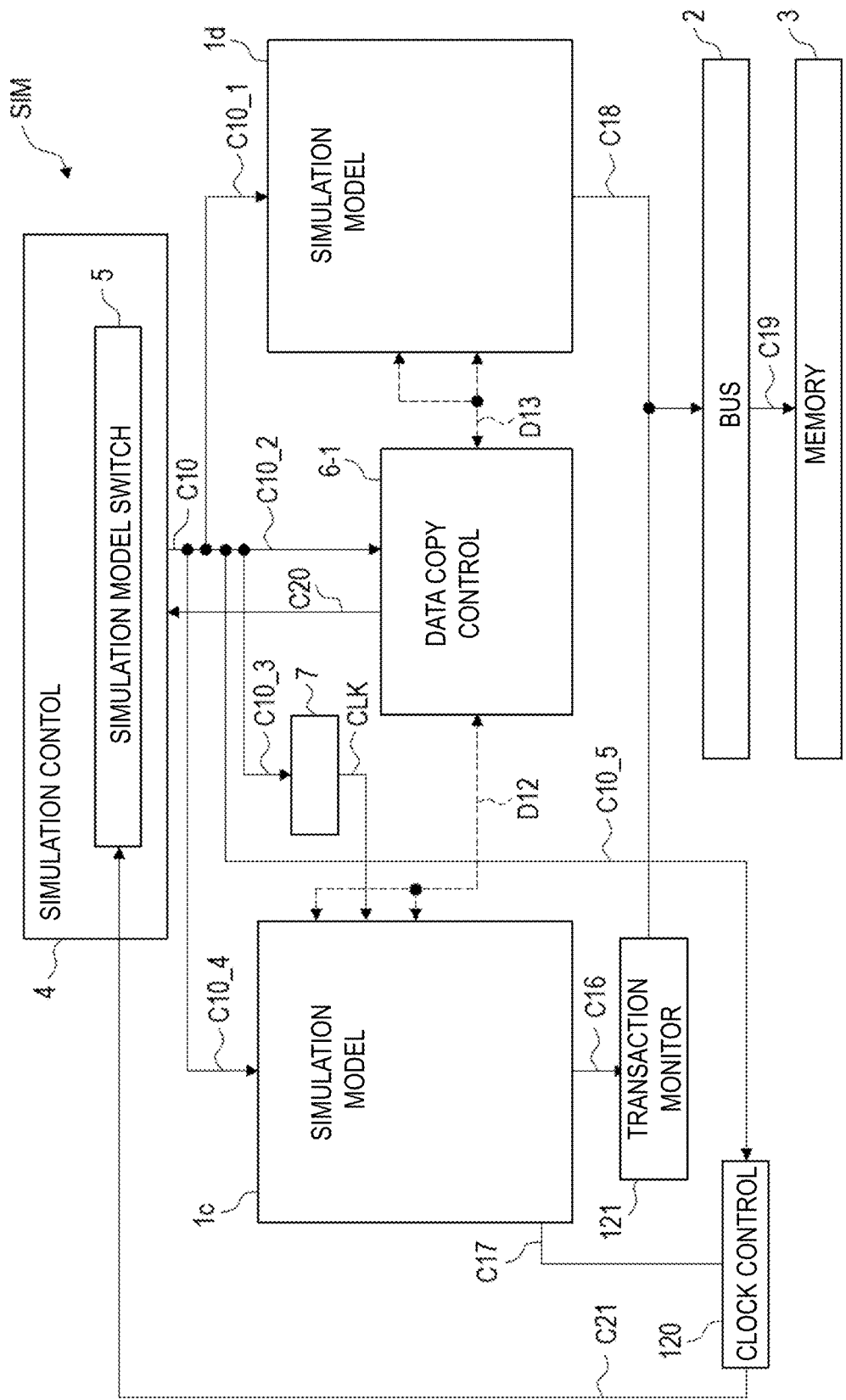
FIG. 8 is a diagram showing a configuration of a simulator according to fourth embodiment.

FIG. 8 is a diagram illustrating a configuration of a simulator according to fourth embodiment. In FIGS. 8, 1c and 1d illustrate a simulation model. In the following discussion, the simulation models 1c and 1d are also referred to simply as models 1c and 1d. The models 1c and 1d correspond to the core units 1a and 1b in first to third embodiments. Here, as a model 1c, a register transfer level corresponding to actual hardware (hereinafter, referred to as RTL) model is taken as an example, as a model 1d, illustrating a simulator SIM using an operation level model as an example.

Here, the RTL model is a model in which the behavior of the register with respect to the clock is described in a computer language (Verilog HDL language, VHDL language). The operation level model is a model in which the operation and algorithm of actual hardware are described in the computer language (C language and SystemC language). In this way, the abstraction levels representing actual hardware differ between the model 1c and the model 1d.

As shown in FIG. 8, the simulator SIM is equipped with two models 1c and 1d to simulate one target processor as well as first to third embodiments. In FIGS. 8, 2 to 5 show the bus unit, the memory unit, the simulation control unit, and the simulation model switch unit in the same manner as in FIG. 1. Also, 6_1 indicates the data copy control unit changed in fourth embodiment. Furthermore, in FIG. 8, 7 is a clock control unit, 120 is a transaction monitor unit, 121 is a transactor.

Figure 9:
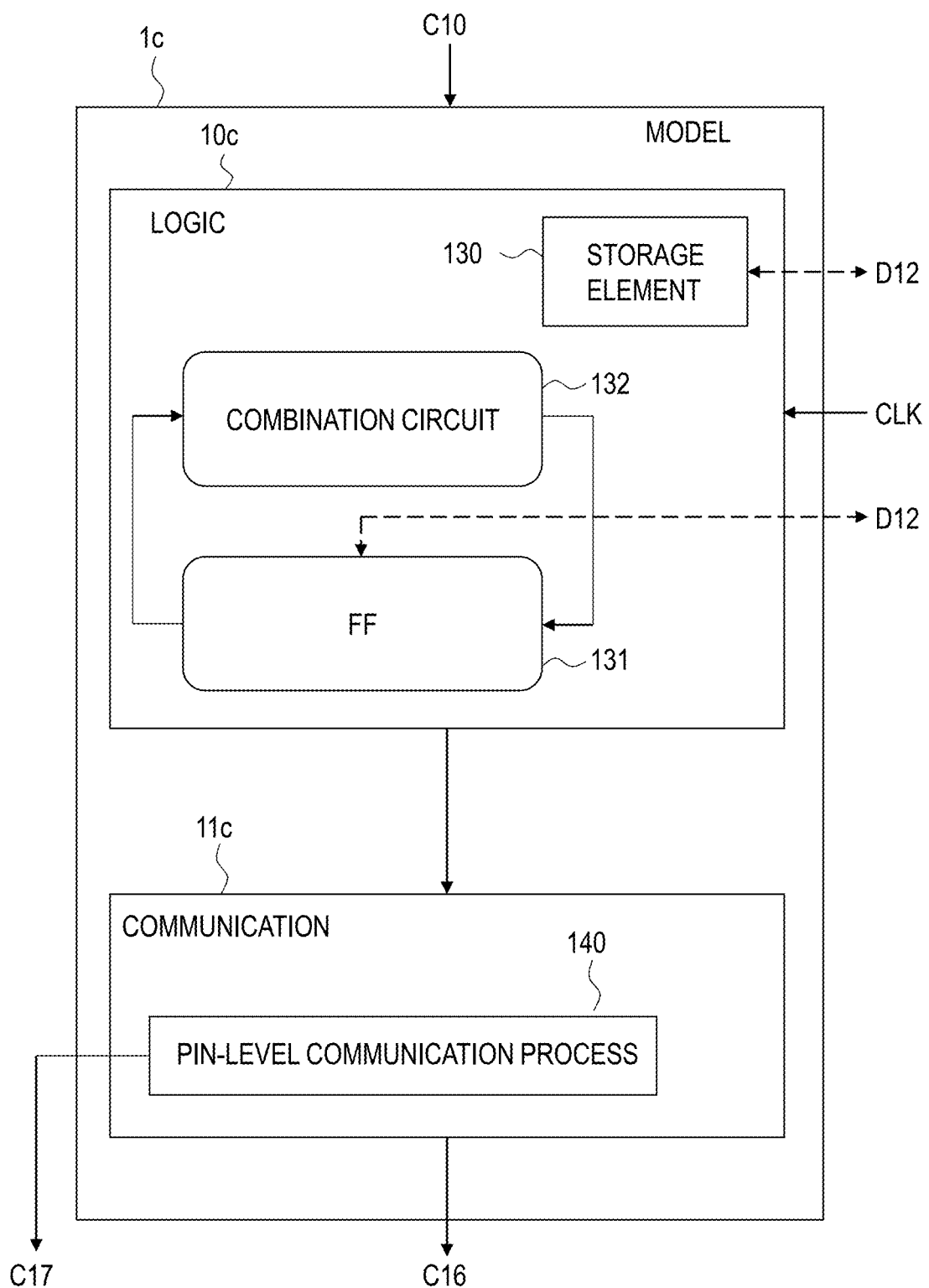
FIG. 9 is a diagram showing a configuration of a model according to fourth embodiment.
Figure 10:
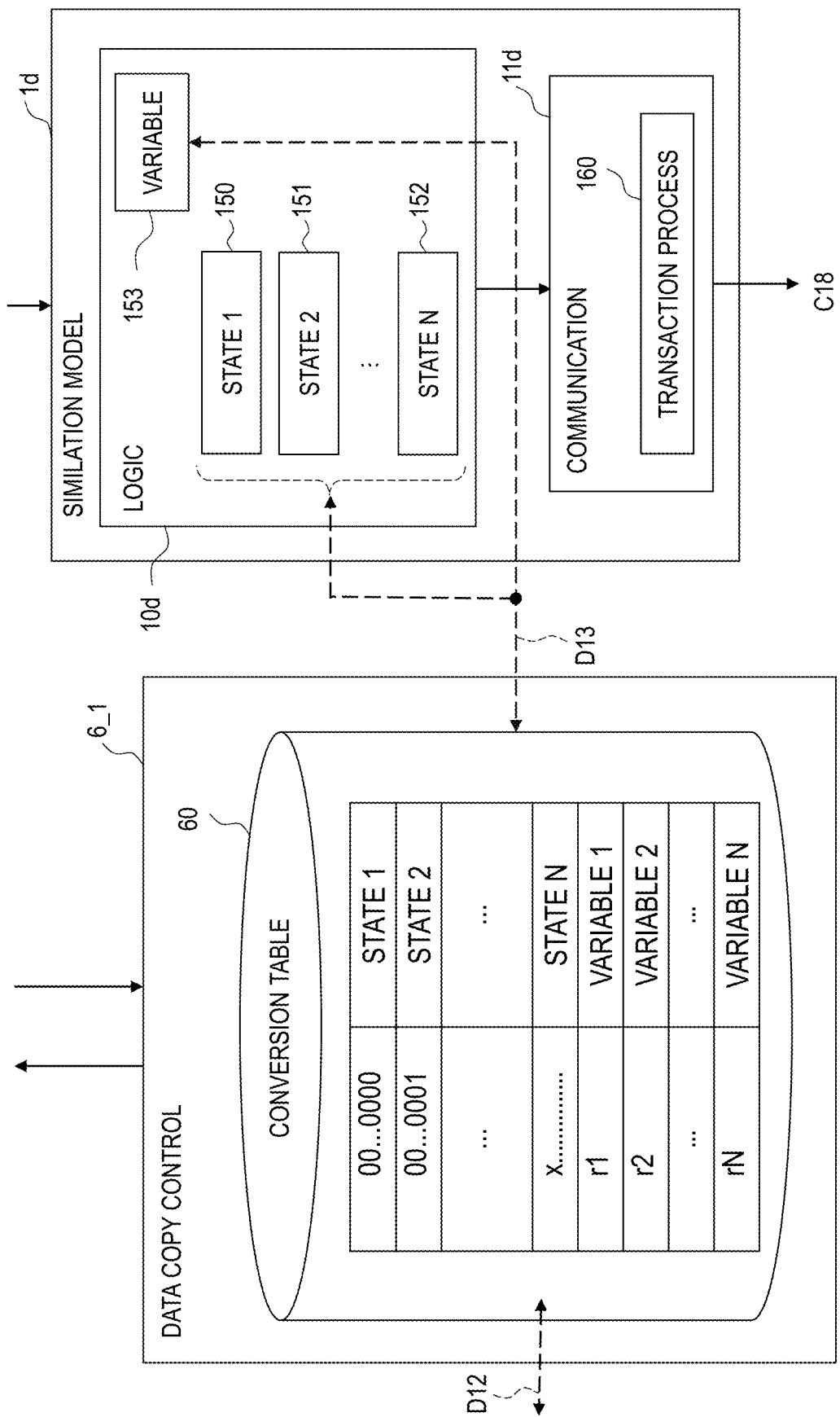
FIG. 10 is a diagram showing a configuration of a model and data copy control unit according to fourth embodiment.

A detailed example of the model 1c, 1d and the data copy control unit 6_1 is shown in FIGS. 9 and 10. FIG. 9 is a diagram showing a configuration of a model according to fourth embodiment. Further, FIG. 10 is a diagram showing a configuration of a model and a data copy control unit according to fourth embodiment.

The model 1c, as shown in FIG. 9, includes a logic unit 10c and a communication unit 11c. Similarly, the model 1d also includes a logic unit 10d and a communication unit 11d as shown in FIG. 10.

The logic unit 10c of the model 1c stores a combination circuit 132, a flip-flop (FF) 131, and a storage element 130. On the other hand, the hardware states 150 to 152 (states 1 to N) and the variables 153 are stored in the logic unit 10d of the model 1d. Further, the communication unit 11c includes a pin-level communication process unit 140 that performs pin-level communication, and the communication unit 11d includes a transaction process unit 160 that performs blocking access. By each of the logic units 10c and 10d, a simulation of the processing in the target processor is performed. Further, the communication unit 11c and 11d, simulation of the communication between the target processor and the bus unit 2 or the like is performed.

The bus unit 2 and the memory unit 3 are constituted by an operation-level model in fourth embodiment. That is, the bus unit 2 and the memory unit 3 of the operation level model are commonly accessed by the model 1c which is an RTL model and the model 1d which is an operation level model. For this reason, when accessing the bus unit 2 and the memory unit 3 of the operation level model from the model 1c having the different abstract levels, the transactor 121 of FIG. 8 converts the pin-level data from the pin-level communication process unit 140 into the transaction-level data and supplies the data to the bus unit 2.

The transaction monitor unit 120 of FIG. 8 monitors bus access by the pin-level communication process unit 140. In addition, the clock control unit 7 of FIG. 8 controls the input of the clock control signal CLK of the logical unit 10c in the model 1c as events in response to the mode switching notification control signal C10 C10_3 from the simulation/model switch unit 5. Logic unit 10c operates on the basis of the clock control signal CLK.

The data copy control unit 6_1 includes a conversion table 60 as shown in FIG. 10. In the conversion table 60, data indicating the correspondence between the state 1 to the state N stored in the logic unit 10d of the model 1d and the flip-flop 131 stored in the logic unit 10c of the model 1c is set. Further, in the conversion table 60, the data indicating the correspondence between the variable 153 of the model 1d and the storage element 130 of the model 1c is set. Using the data set in the conversion table 60, the values are converted between the status of the model 1d, the variables, the flip-flops of the model 1c, and the storage elements, and the data is copied between the model 1c and the model 1d.

(Switching from Model 1d to Model 1c)

Next, the operation when the switching to the model 1c occurs when the simulation is being performed in the model 1d will be described. A notification control signal C10 for requesting model switching is generated from the simulation model switch unit 5.

When the notification control signal C10 is generated, the operation of the model 1d is stopped by the notification control signal C10_1. Further, the simulation model switch unit 5 notifies the data copy control unit 6_1 that a request for switching from the model 1d to the model 1c has occurred by the notification control signal C10_2. In response to the notification control signal C10_2, the data copy control unit 6_1 converts the data D13 from the model 1d using the data set in the conversion table 60, and generates the data D12. The generated data D12 is supplied to the model 1c and copied to the model 1c.

When the data copy is completed, the data copy control unit 6_1 notifies the simulation model switch unit 5 of the completion of the data copy by the notification control signal C20. In response to this notification, the simulation model switch unit 5 instructs the clock control unit 7 to provide a clock control signal CLK to the model 1c. When the clock control signal CLK is supplied, the model 1c starts running. Prior to starting the execution, since the data relating to the processing performed in the model 1d has been converted and copied to the logic unit 10c, the model 1c will continue to execute the process in the model 1d.

(Switching from Model 1c to Model 1d)

Next, the operation when the switching to the model 1d occurs when the simulation is being performed in the model 1c will be described. In this case, the simulation model switch unit 5, with respect to the clock control unit 7, that the switching request to the model 1d has occurred, notices the notification control signal C10_3. The simulation model switch unit 5 notifies the model 1c of the occurrence of a switching request to the model 1d by the notification control signal C10_4, and notifies the transaction monitor unit 120 of the occurrence of a switching request to the model 1d by the notification control signal C10_5.

Clock control unit 7, in response to the notification of switching by the notification control signal C10_3, stops supplying the clock control signal CLK to the model 1c.

Further, the transaction monitor unit 120, upon receipt of the notification of switching by the notification control signal C10_5, starts monitoring whether all uncompleted pin-level communication has been processed. When all the processes are completed, the transaction monitor unit 120 notifies the simulation model switch unit 5 of the completion by the notification control signal C21.

When the notification control signal C21 notifies that all pin-level communications have been processed, the simulation model switch unit 5 instructs the data copy control unit 6_1 to convert and copy data using the conversion table 60 by the notification control signal C10_2. In response to this instruction, the data copy control unit 6_1 converts the data D12 from the model 1c using the conversion table 60, and supplies the converted data as the data D13 to the model 1d. As a result, the converted data is copied to the logical unit 10d.

When the data copy is completed, the data copy control unit 6_1 notifies the simulation model switch unit 5 of the completion of the data copy by the notification control signal C20. In response to the notification control signal C20, the simulation model switch unit 5 notifies the model 1d of the switching by the notification control signal C10_1. This initiates simulation of the motion-level model in the model 1d. When starting this execution, since the data of the model 1c is converted and copied to the logic unit 10d, the simulation continued to the simulation in the model 1c will be executed in the model 1d.

According to fourth embodiment, even if the abstract levels are different, the simulation can be switched at any time. Furthermore, it is possible to prevent false simulations from occurring because the model switching takes place after all the transaction has been completed.

In first to fourth embodiments, the core unit simulating the processor (target processor) and the unit simulating the bus and memory (bus and memory unit) have been described as examples. However, the unit simulating the peripheral block may be used instead of the memory. Of course, the simulator SIM may include units that simulate buses, memories and peripheral blocks, and units that simulate processors.

Buses, memories, and peripheral blocks, including processors, are provided, for example, as IP (Intellectual Property). Here, the IP corresponding to the bus, memory, and peripheral blocks which are slave blocks are regarded as slave IP, and the IP corresponding to the processor is regarded as master IP. Considering the installation of many slave IPs in semiconductor device, the arts described in Patent Document 1 require that each slave IP be modified, increasing the man-hours. Also, commercially available slave IPs may be difficult to retrofit and may be difficult to apply the arts described in Patent Document 1. On the other hand, according to first to fourth embodiments, even if the slave-IP is not modified, the mode can be switched while suppressing malfunction. Therefore, it is possible to suppress the increase in man-hours and also mount a commercially available slave IP.

Further, according to first to third embodiments, it is possible to suppress a decrease in precision in the process of non-blocking access after a request for switching from a high-precision mode to a high-speed mode occurs. In the simulator SIM relating to first to third embodiments, the updating of program counters is stopped so as to stop the execution of subsequent instructions in response to switching requests, and the completion of the transaction of non-blocking access is monitored. When the transaction for non-blocking access is completed, the fast mode is executed. Since execution of subsequent instructions is stopped, no new processing corresponding to subsequent instructions is performed while waiting for the non-blocking access transaction to complete. When read access has occurred in non-blocking access, data read by read access is read into, for example, a register (not shown) in the core unit 1a even while waiting for the completion of the transaction. Therefore, in the process of non-blocking access, it is possible to suppress the precision is lowered.

Although the invention made by the present inventor has been specifically described based on the embodiment, the present invention is not limited to the embodiment described above, and it is needless to say that various modifications can be made without departing from the gist thereof.

What is claimed is:

1. A simulator comprising:
    a first core unit corresponding to a first simulation model;
    a second core unit corresponding to a second simulation model different from the first simulation model, the first simulation model being a model for simulating with higher precision than the second simulation model, the second simulation model being a model for simulation at a higher speed than the first simulation model;
    a data copy control unit connected between the first core unit and the second core unit;
    a slave block unit that communicates with either the first core unit or the second core unit; and
    a simulation control unit for making either the first core unit or the second core unit execute instructions,
    wherein the first core unit includes:
        an instruction execution unit for executing a program for the first simulation model while updating a program counter;
        an instructions execution control unit for controlling the instructions unit execution unit;
        a data unit for receiving data that is generated when the program is executed;
        a high speed mode instruction execution control unit that, in response to receiving a switching request for switching from the first simulation model to the second simulation model, taking over a role of controlling the instructions execution unit from the instructions execution control unit to stop subsequent instructions from being executed; and
        a transaction monitor unit for monitoring whether all transaction processing between the first core unit and the slave block unit is completed or not,
    wherein, in response to receiving a notification of completion of all transaction processing from the transaction monitor unit, the simulation control unit instructs the data copy control unit to copy data in the data unit of the first core unit to a data unit of the second core unit, and
    wherein, in response to receiving from the data copy control unit a notification of completion of copying the data from the data unit of the first core unit to the data unit of the second core unit, the simulation control unit causes the second core unit to execute instructions.

2. The simulator according to claim 1, wherein the transaction processing is a non-blocking access transaction processing.

3. The simulator according to claim 1, wherein, in response to receiving the switching request, the high speed mode instructions execution control unit stops the program counter until all transaction processing is completed, to stop the execution of the subsequent instruction and advance the simulation time.

4. The simulator according to claim 1,
    wherein the first core unit and the second core unit correspond to a simulation model of different abstract levels from each other, and
    wherein the data copy control unit includes a conversion table for matching the different abstract levels.

5. A simulation method for a simulator,
    wherein the simulator comprises:
        a first core unit corresponding to a first simulation model;
        a second core unit corresponding to a second simulation model different from the first simulation model, the first simulation model being a model for simulating with higher precision than the second simulation model, the second simulation model being a model for simulation at a higher speed than the first simulation model;
        a data copy control unit connected between the first core unit and the second core unit;
        a slave block unit that communicates with either the first core unit or the second core unit; and
        a simulation control unit for making either the first core unit or the second core unit execute instructions, and
    wherein the simulation method comprises:
        receiving a request for switching from the first simulation model to the second simulation model;
        in response to receiving the request, stopping subsequent instructions from being executed in the first simulation model;
        monitor whether all transaction processing between the first core unit and the slave block unit is completed;
        in response to receiving a notification of completion of all transaction processing, instructing the data copy control unit to copy data in a data unit of the first core unit to a data unit of the second core unit; and
        in response to receiving a notification of completion of copying the data from the data unit of the first core unit to the data unit of the second core unit, causing the second core unit to execute instructions.

* * * * *